United States Patent
Yasuda et al.

(10) Patent No.: US 8,525,722 B2
(45) Date of Patent: Sep. 3, 2013

(54) AD CONVERTING DEVICE, DIAL-TYPE INPUT DEVICE, AND RESISTANCE-VOLTAGE CONVERSION CIRCUIT

(75) Inventors: Toshiro Yasuda, Itami (JP); Makoto Hangaishi, Toyonaka (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 13/418,864

(22) Filed: Mar. 13, 2012

(65) Prior Publication Data

US 2012/0235845 A1 Sep. 20, 2012

(30) Foreign Application Priority Data

Mar. 16, 2011 (JP) .................................. 2011-058177

(51) Int. Cl.
*H03M 1/50* (2006.01)

(52) U.S. Cl.
USPC ............................ 341/168; 341/155; 341/156

(58) Field of Classification Search
USPC ......................... 341/155, 156, 168, 118, 120
See application file for complete search history.

(56) References Cited

U.S. PATENT DOCUMENTS 4,342,983 A * 8/1982 Weigand et al. .............. 341/120
4,549,165 A * 10/1985 Brian ............................ 341/118

FOREIGN PATENT DOCUMENTS

JP 5-83135 4/1993

* cited by examiner

*Primary Examiner* — Jean B Jeanglaude
(74) *Attorney, Agent, or Firm* — Cooper & Dunham LLP

(57) ABSTRACT

An AD converting device includes a resistance-voltage conversion circuit which changes a first integrated voltage in proportion to a product of a varied resistance of a variable resistance and an electrical current applied to the variable resistance and changes a second integrated voltage and a reference voltage in proportion to a product of a total resistance of the variable resistance and the electrical current.

9 Claims, 2 Drawing Sheets

AD CONVERTING DEVICE, DIAL-TYPE INPUT DEVICE, AND RESISTANCE-VOLTAGE CONVERSION CIRCUIT

CROSS REFERENCE TO RELATED APPLICATIONS

The present application is based on and claims priority from Japanese Patent Application Number 2011-058177, filed on Mar. 16, 2011, the disclosure of which is hereby incorporated by reference herein in its entirety.

BACKGROUND OF THE INVENTION

1. Field of the Invention

The present invention relates to an AD converting device having a double integral AD converter, a dial-type input device, and a resistance-voltage conversion circuit.

2. Description of the Related Art

FIG. 3 shows a configuration of a commonly-used double integral AD converter 10. The double integral AD converter 10 has a switch 11, an integrator 12, a comparator 13 and a logic block 14. The switch 11 selectively outputs one of an input first integrated voltage Vin and a second integrated voltage −Vref in accordance with a command from the logic block 14. The integrator 12 has an operational amplifier 12a, a resistance 12b, and a capacitor 12c. The operational amplifier 12a has a − terminal to which an output from the switch 11 via the resistance 12b is input and a + terminal which is grounded. The operational amplifier 12a integrates differences between a voltage input to the − terminal and a voltage input to the + terminal and outputs a voltage depending on a result of the integration according to a time constant determined by a resistance value R of the resistance 12b and a capacity C of the capacitor 12c. The comparator 13 has a − terminal to which the output voltage of the integrator 12 is input and a + terminal which is grounded. When the output voltage of the integrator 12 is equal to the ground potential, the comparator 13 outputs a signal. The logic block 14 receives the output of the comparator 13 and a clock. The logic block 14 counts the input clocks and controls the switch 11 based on the counted value (hereinafter, referred to as integral time. The logic block 14 outputs the counted value (integral time) as a digital value when receiving the signal from the comparator 13.

Referring to FIG. 4, an integrating operation of the double integral AD converter 10 will be explained. FIG. 4 shows outputs of the integrator 12 of the double integral AD converter 10 over time. In the double integral AD converter 10, when an AD converting operation is started, the logic block 14 switches the switch 11 such that the first integrated voltage Vin is input to the switch 11 and at the same time, starts to count the integral time. When the switch 11 is switched to a side of the first integral voltage Vin, the integrator 12 performs a first integration until the counted value (integral time) becomes a first counted value T0 (hereinafter, referred to as first integral time T0). During the first integration, the output of the integrator 12 constantly decreases with a slope of −Vin/RC as shown in FIG. 4. When the counted value (integral time) becomes the first counted value T0 (first integral time T0), the logic block 14 switches the switch 11 so as to receive the second integrated voltage −Vref, and, at the same time, starts to newly count an integral time. At the same time with the switching operation, the integrator 12 also starts to perform a second integration. The second integrated voltage −Vref is inversely polarized to the first integrated voltage Vin. Therefore, during the second integration, the output of the integrator 12 constantly increases with a slope of Vref/RC. When the output of the integrator 12 returns to 0, the comparator 13 outputs to the logic block 14 a signal indicating that the output of the integrator 12 returns to 0. When receiving the signal, the logic block 14 outputs the counted value T obtained when the logic block 14 receives the signal (hereinafter, referred to as second integral time T) as an output of the AD converter 10 as a digital value. Since the second integrated voltage −Vref is constant, the second integral time T is a value proportional to the first integrated voltage Vin.

The above double integral operation is shown by the following formula (1). The following formula (2) is obtained by solving the formula (1) and arranging the obtained formula as a formula about T. Since the second integrated voltage −Vref and the counted value T0 are constant values, the second integral time T is proportional to the first integrated voltage Vin. The second integral time T does not depend on the resistance R and the capacity C as shown in the formula (2).

$$-\frac{1}{RC}\int_0^{T_0} V_{in}\,dt + \frac{1}{RC}\int_0^{T} V_{ref}\,dt = 0 \qquad (1)$$

$$T = \frac{V_{in}}{V_{ref}} T_0 \qquad (2)$$

In general, the double integral AD converter performs two integral operations, that is, the first integration in which the integration of the first integrated voltage Vin is performed and the second integration in which the integration of the second integrated voltage −Vref is performed. Therefore, a conversion rate of the double integral AD converter is lower than the other type AD converter but high conversion accuracy can be achieved. Accordingly, the double integral AD converter is used in a digital multi-meter, a digital temperature sensor, or the like.

Japanese Patent Application Publication No. H05-083135 discloses that a second integrated voltage is divided to form a reference voltage and the reference voltage is input to an integrator of a double integral AD converter and a comparator and the reference voltage.

In a dial-type tuning radio, and the like, a dial is operated to switch a received frequency. The dial is, for example, formed by a potentiometer. The potentiometer is, for example, formed by a variable resistance in which a resistance value varies according to a rotational angle. In order to convert a rotational amount of the dial of the potentiometer into a digital output by using the double integral AD converter, it is necessary to convert a resistance value obtained after being varied by the variable resistance of the potentiometer into a voltage and input the voltage to the double integral AD converter.

As shown in FIG. 5, a method for obtaining a first integrated voltage Vin by simply applying an electrical current from a current source 22 to the variable resistance 23 of the potentiometer 21 was considered. However, in this method, if the resistance value Rv of the variable resistance 23 or the current value I of the electrical current applied to the variable resistance varies according to a manufacturing variation of the potentiometer 21 and the current source 22 or a usage environment such as a temperature, the first integrated voltage Vin varies. Therefore, as shown by a broken line in FIG. 4, a slope of the first integration −Vin/RC changes and the output of the integrator 12 in the first integration after the first integral time T0 changes. On the other hand, the second integrated voltage −Vref is substantially constant and a value of a slope of the second integration Vref/RC does not change. Therefore, time until the output from the integrator 12 in the second integration becomes zero, that is, the second integral time changes, for example, from T to T' as shown in FIG. 4. That is, there is a problem in that, even when the rotational amount of the dial of the potentiometer 21 is the same, the second integral time varies according to the manufacturing variation or the usage environment.

This is shown by the following formula (3). That is, when Rv indicates the resistance value of the variable resistance 23 of the potentiometer 21, x indicates the rotational amount (rate of the rotation) of the potentiometer 21, and I indicates the electrical current applied from the current source 22, the first integrated voltage Vin is shown by the formula (3). The formula (4) is obtained by substituting the formula (3) into the formula (1). That is, as shown in the formula (3), even if the value of x is constant, the value of the second integral time T (digital output) varies when the electrical current I applied from the current source 22 and/or the resistance value Rv of the variable resistance 23 of the potentiometer 21 varies.

$$V_{in} = xR_v I \quad (0 \le x \le 1) \tag{3}$$

$$T = \frac{xR_v I}{V_{ref}} T_0 \tag{4}$$

SUMMARY OF THE INVENTION

An object of the present invention is to provide an AD converting device, a dial-type input device, and a resistance-voltage conversion circuit, in which, even when a resistance value of the variable resistance of the potentiometer or an electrical current applied from the current source varies according to a manufacturing variation, a usage environment, or the like, digital output without influence of the manufacturing variation, the usage environment, or the like can be obtained.

To achieve the above object, an AD converting device according to an embodiment of the present invention includes a double integral AD converter having an integrator which, when a first integrated voltage is input to the integrator, performs a first integration in which a difference between the first integrated voltage and a reference voltage is integrated, after the first integration is performed and when a second integrated voltage is input to the integrator, performs a second integration in which a difference between the second integrated voltage and the reference voltage is integrated, and outputs an integrated voltage according to at least the second integration; and an output part which receives the integrated voltage output from the integrator and the reference voltage, counts time from when the second integration is started to when the integrated voltage becomes equal to the reference voltage, and outputs the counted time as a digital value; a variable resistance; and a resistance-voltage conversion circuit which changes the first integrated voltage in proportion to a product of a resistance value of the variable resistance after being varied in the variable resistance and a value of an electrical current applied to the variable resistance and changes the second integrated voltage and the reference voltage in proportion to a product of a total resistance value of the variable resistance and the electrical current applied to the variable resistance.

DETAILED DESCRIPTION OF THE PREFERRED EMBODIMENTS

An embodiment of the present invention will be explained with reference to the attached drawings.

1. Configuration

Figure 1:
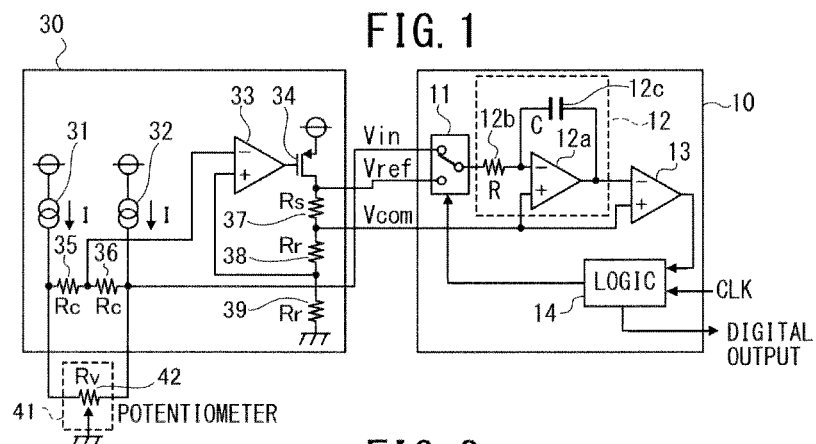
FIG. 1 is a view showing a configuration of a dial-type input device according to an embodiment of the present invention.

FIG. 1 is a configuration diagram of a dial-type input device according to an embodiment of the present invention. The dial-type input device has an AD converting device having a potentiometer 41, a double integral AD converter 10, and a resistance-voltage conversion circuit 30. The configuration of the double integral AD converter 10 is the same as one explained with reference to FIG. 3 and therefore detailed explanation will be omitted. The + terminals of the integrator 12 and the comparator 13 of the double integral AD converter 10 are not grounded but receive the later-described reference voltage Vcom.

The potentiometer 41 is configured by using a three-terminal type variable resistance 42. The variable resistance 42 includes fixed terminals at both ends and an adjustment terminal between the fixed terminals. A rotary type potentiometer for detecting a rotational amount is used as the potentiometer 41. A dial for operation is provided on a rotational shaft of the potentiometer 41 and a position of the adjustment terminal of the variable resistance 42 is changed by rotating the dial to change the resistance value between the adjustment terminal and the fixed terminals at both ends.

The resistance-voltage conversion circuit 30 is a circuit for converting the resistance value after being varied in the variable resistance 42 of the potentiometer 41 into a voltage. The resistance-voltage conversion circuit 30 has two current sources 31, 32, an operational amplifier 33, a p-type transistor 34, and resistances 35, 36, 37, 38, 39. The values of the resistances 35, 36, 37, 38, 39 are set to Rc, Rc, Rs, Rr, Rr, respectively. In this embodiment, Rs and Rr has the relationship of Rs=2Rr. The AD converter 10 and the resistance-voltage conversion circuit 30 are integrated in one integrated circuit. However, it is not limited thereto and the AD converter 10 and the resistance-voltage conversion circuit 30 may not be in a form of the integrated circuit.

Output of the current source 31 is connected to one fixed terminal of the variable resistance 42 and output of the current source 32 is connected to the other fixed terminal of the variable resistance 42. The two current sources 31, 32 are formed by a current mirror circuit and generate the same electrical current I.

The resistances 35, 36 are connected in series between the fixed terminals of the variable resistance 42 of the potentiometer 41.

The p-type transistor 34 has a source connected to a power source and a gate to which output from the operational amplifier 33 is input.

The resistances 37, 38, 39 are connected in series between drain and ground of the p-type transistor 34 in order from a side of the p-type transistor 34.

The operational amplifier 33 has a − terminal connected to a connection part of the two resistances 35, 36 and a + terminal connected to a connection part of the resistances 37, 38.

2. Operation

Hereinafter, an operation of the dial-type input device according to the embodiment of the present invention will be explained.

the AD converting device according to this embodiment includes the double integral AD converter (10), the variable resistance, and the resistance-voltage conversion circuit (30). The double integral AD converter has the integrator (12) which, when a first integrated voltage (Vin) is input to the integrator, performs a first integration in which a difference between the first integrated voltage (Vin) and a reference voltage (Vcom) is integrated, after the first integration is performed and when a second integrated voltage (Vref) is input to the integrator, performs a second integration in which a difference between the second integrated voltage (Vref) and the reference voltage (Vcom) is integrated, and outputs an integrated voltage according to at least the second integration. The double integral AD converter has an output part (13) which receives the integrated voltage output from the integrator and the reference voltage, counts time from when the second integration is started to when the integrated voltage becomes equal to the reference voltage, and outputs the counted time as a digital value. The resistance-voltage conversion circuit (30) changes the first integrated voltage in proportion to a product of a resistance value of the variable resistance after being varied in the variable resistance and a value of an electrical current (I) applied to the variable resistance and changes the second integrated voltage and the reference voltage in proportion to a product of a total resistance value of the variable resistance and the electrical current applied to the variable resistance.

The resistance-voltage conversion circuit 30 outputs a voltage of a connection part of the − terminal of the variable resistance 42 and an output of the current source 32 as the first integrated voltage Vin of the double integral AD converter 10, outputs a voltage of a connection part of the drain of the p-type transistor 34 and the resistance 37 as the second integrated voltage Vref of the double integral AD converter 10, and outputs a reference voltage Vcom of a connection part of the resistances 37, 38 to the + terminal of the operational amplifier 12a of the integrator 12 and the + terminal of the comparator 13 of the double integral AD converter 10. The changes of the above voltages will be described later.

When the double integral AD converter 10 receives the first integrated voltage Vin, the second integrated voltage Vref, and the reference voltage Vcom from the resistance-voltage conversion circuit 30, the double integral AD converter 10 operates in the following way. That is, the integrator 12 of the double integral AD converter 10 performs the first integration in which difference between the first integrated voltage Vin and the reference voltage Vcom is integrated, when the first integrated voltage Vin is input from the resistance-voltage conversion circuit 30. After the first integration is performed, the integrator 12 performs the second integration in which difference between the second integrated voltage Vref and the reference voltage Vcom is integrated, when the second integrated voltage Vref is input, and then outputs an integrated voltage according to a value of the integral. The comparator 13 receives the integrated voltage output from the integrator 12 and the reference voltage Vcom and compares the integrated voltage with the reference voltage Vcom. If the integrated voltage is equal to the reference voltage Vcom, the comparator 13 outputs a signal indicating that the integrated voltage is equal to the reference voltage Vcom to the logic block 14. When the logic block 14 receives the signal, the logic block 14 outputs the counted value Y (the second integral time T) at that time as the output of the AD converter 10 as a digital value.

A voltage, and the like of each part in the dial-type input device will be explained by using the following formulas. In case that the rotational amount of the dial of the potentiometer 41 is x, the first integrated voltage Vin is shown by the above formula (3). The voltage V− input to the −terminal of the operational amplifier 33 is shown by the following formula (5).

$$V_- = \frac{R_v I + 2(1-x)x\frac{R_v^2}{R_c}I}{2 + \frac{R_v}{R_c}} \quad (5)$$

In this embodiment, the resistance value Rc of the resistances 35, 36 is set to be substantially larger than the resistance value Rv of the variable resistance 42 of the potentiometer 41. Therefore, the voltage of the connection part of the resistances 35, 36, that is, the voltage V− to be input to the −terminal of the operational amplifier 33 can be approximately shown by the following formula (6). Furthermore, the resistance-voltage conversion circuit 30 according to this embodiment of the present invention has a configuration in that virtual short between the −terminal and the +terminal of the operational amplifier 33 occurs. Therefore, the voltage V+ input to the +terminal of the operational amplifier 33 is equal to the voltage V− of the −terminal as shown in the following formula (7).

$$V_- = \frac{R_v I}{2} \quad (6)$$

$$V_+ = V_- = \frac{R_v I}{2} \quad (7)$$

Input impedances of the +terminal and the −terminal of the operational amplifier 12a of the integrator 12 and the +terminal of the comparator 13 become high and therefore, the reference voltage Vcom and the second integrated voltage Vref are shown by the following formula (8), (9), respectively.

$$V_{com} = 2V_+ R_v I \quad (8)$$

$$V_{ref} = 2V_{com} = 2R_v I \quad (9)$$

Figure 3:
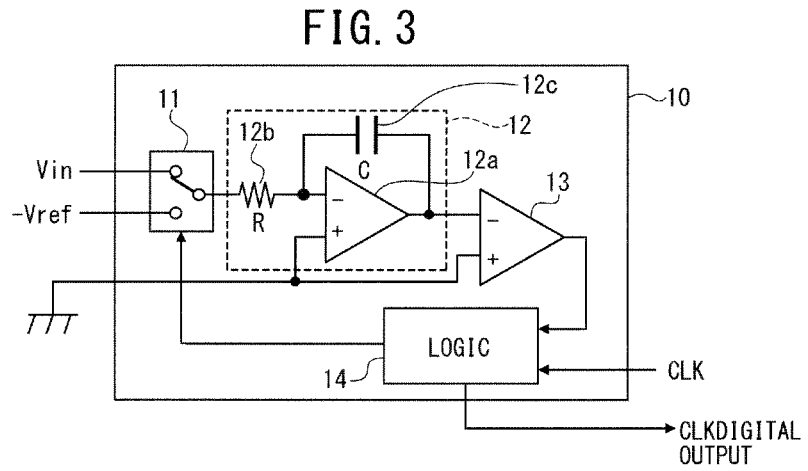
FIG. 3 is a view showing a configuration of a common double integral AD converter.
Figure 4:
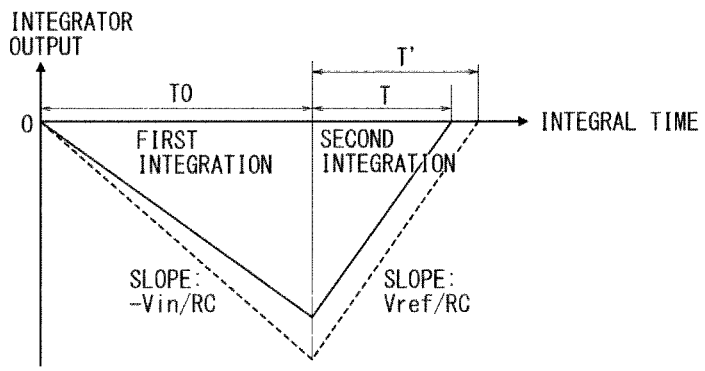
FIG. 4 is a view showing a time change of output of an integrator of a conventional double integral AD converter.
Figure 5:
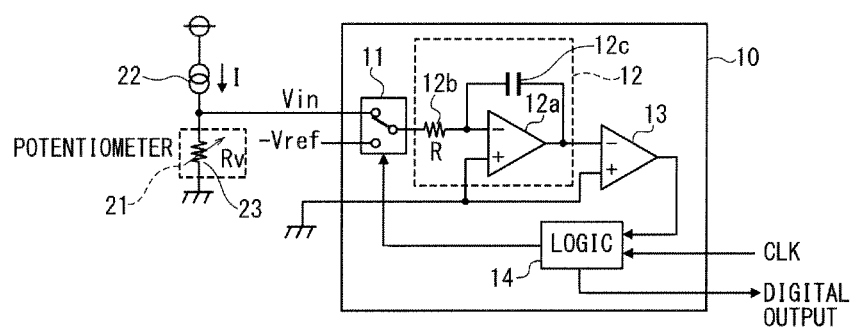
FIG. 5 is a view showing a configuration in case where a first integrated voltage which is an input voltage of an integrator of a common double integral AD converter is obtained by applying an electrical current to a variable resistance.

The +terminal of the integrator 12 and the +terminal of the comparator 13 in the conventional circuit as shown in FIGS. 3 and 5 are grounded. On the other hand, the +terminal of the comparator 13 in the circuit of this embodiment shown in FIG. 1 receives the reference voltage Vcom. Therefore, the first integrated voltage is (Vcom−Vin), and the second integrated voltage is (Vref−Vcom). In this embodiment, the second integral time T is shown by the following formula (10) by substituting Vin in the formula (2) with Vcom−Vin, and Vref with Vref−Vcom.

$$T = \frac{V_{com} - V_{in}}{V_{ref} - V_{com}} T_0 \quad (10)$$

By substituting the formulas (3), (8), (9) into the formula (10) and arrange the formula, the following formula (11) is obtained. As shown in the formula (11), the second integral time T does not depend on the resistance value Rv of the variable resistance 42 of the potentiometer 41 and the current value I of the current sources 31, 32 and only depends on the rate of the rotation x of the potentiometer 41. That is, even when the resistance value Rv of the variable resistance 42 and the value I of the electrical current applied to the variable resistance 42 vary according to a manufacturing variation and a usage environment, influence on the second integral time T (digital output) is canceled. Therefore, the digital output without influence of the manufacturing variation, the usage environment, and the like can be obtained.

$$T=(1-x)T_0 \quad (11)$$

The first integrated voltage Vin varies in proportion to a product of the resistance value after being varied in the variable resistance 42 and the value I of the electrical current applied to the variable resistance 42 and therefore is shown by Vin=α×x×Rv×I, where α is a constant. On the other hand, the second integrated voltage Vref and the reference voltage Vcom vary in proportion to a product of a total resistance value (resistance value between both ends) of the variable resistance 42 and the value I of the electrical current applied to the variable resistance 42 and therefore are respectively shown by Vref=β×Rv×I and Vcom=γ×Rv×I, where each of β and γ is a constant. By substituting these formulas into the above formula (10) and arranging the formula, the following formula (12) is obtained.

$$T=(\gamma-x\cdot\alpha)/(\beta-\gamma)\cdot T0 \quad (12)$$

As shown in the above formula, the second integral time T does not depend on the resistance value Rv of the variable resistance 42 and the value I of the electrical current applied to the variable resistance 42 and only depends on the constants α, β, γ, the rotational amount x of the variable resistance 42 and the first integral time T0. Since the constants α, β, γ and the first integral time T0 are constant, the second integral time T varies based on only the rotational amount x. That is, even when the resistance value Rv of the variable resistance 42 and the value I of the electrical current applied to the variable resistance 42 vary according to the manufacturing variation and the usage environment, influence on the digital output for the second integral time T is canceled. Therefore, the digital output without the influence of the manufacturing variation, the usage environment, and the like can be obtained.

In this embodiment, the values of α, β, γ are α=1, β=2, γ=1 in the formula (12). By substituting these values into the formula (12), the above formula (11) can be obtained.

Figure 2:
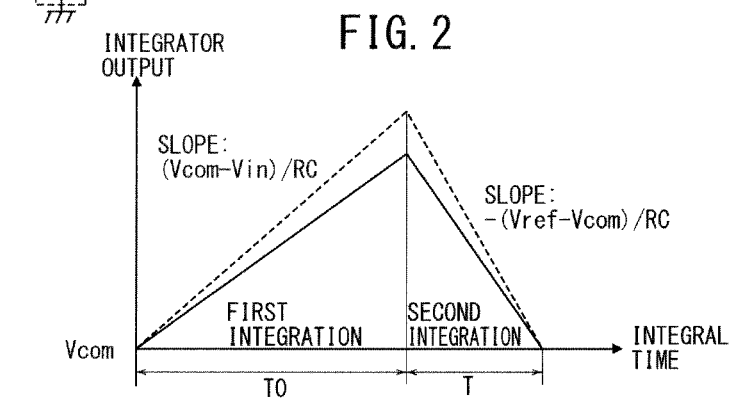
FIG. 2 is a view showing a time change of output of an integrator of a double integral AD converter according to the embodiment of the present invention.

FIG. 2 is a view showing a change of the output of the integrator 12. The output of the integrator 12 constantly increases during the first integration (until the first integral time T0 passes) with a slope (Vcom−Vin)/RC. After the first integral time T0 passes, the second integration starts and the output of the integrator 12 constantly decreases with a slope −(Vref−Vcom)/RC. Even if the slope during the first integration changes as shown by the broken line from the solid line according to the manufacturing variation of the variable resistance 42 and the current sources 31, 32 or the usage environment, the slope during the second integration also changes from the solid line to the broken line and therefore the same second integral time T is obtained. Accordingly, the constant digital output can be obtained. That is, in case where the rotated angle of the dial of the potentiometer 41 is the same, the constant second integral time T (digital output) only based on the rotational amount x without depending on the manufacturing variation and the usage environment can be obtained.

3. Summary

As described above, in the dial-type input device (AD converter) according to the embodiment of the present invention, the first integrated voltage Vin is changed in proportion to the product of the resistance value after being varied in the variable resistance 42 and the value I of the electrical current applied to the variable resistance 42 and the second integrated voltage Vref and the reference voltage Vcom are changed in proportion to a product of the total resistance value Rv (resistance value between both ends) of the variable resistance 42 and the electrical current I applied to the variable resistance 42. Thereby, the second integral time T changes only based on the rotational amount x. That is, even when the resistance value Rv of the variable resistance 42 or the value I of the electrical current applied to the variable resistance 42 changes according to the manufacturing variation or the usage environment, influence on the digital output for the second integral time T is canceled. Therefore, the digital output without influence of the manufacturing variation or the usage environment can be obtained.

The resistance-voltage conversion circuit 30 and the double integral AD converter 10 are integrated on one integrated circuit and therefore only the variable resistance is necessary as an external component so that the cost can be reduced.

The two current sources 31, 32 are formed by a current mirror. Accordingly, the two current sources which apply the same current can be configured with a simple circuit.

Since the dial input device has the above described resistance-voltage conversion circuit 30, digital output with high accuracy for a scale of the dial can be obtained.

In this embodiment, although a rotary-type potentiometer in which the rotational amount is detected is used as the potentiometer, for example, a linear-type potentiometer in which a linear movement is detected may be used.

In this embodiment, the case where α=1, β=2, γ=1 is explained as an example but it is not limited thereto and therefore α, β, γ may be other values.

According to the AD converting device, the dial-type input device, and the resistance-voltage conversion circuit according to an embodiment of the present invention, digital output without influence of a manufacturing variation, usage environment, or the like can be obtained. The AD converting device according to an embodiment of the present invention can be widely applied to an AD converting device using a double integral AD converter.

According to an embodiment of the present invention, in case where an first integrated voltage which is a product of a resistance value after being varied in a variable resistance and a value of an electrical current applied to the variable resistance is changed when the resistance value of the variable resistance or the value of the electrical value applied to the variable resistance changes according to influence of the manufacturing variation, the usage environment, and the like, the second integrated voltage and the reference voltage input to the double integral AD converter together with the first integrated voltage changes in proportion to a product of a total resistance value of the variable resistance and the electrical current applied to the variable resistance. Thereby, in case where the resistance value of the variable resistance or the value of the electrical current applied to the variable resistance changes according to the manufacturing variation, the usage environment, or the like, the influence on the output of the digital value (that is, digital output) on the time from when the second integration is started to when the integrated voltage becomes equal to the reference voltage is canceled. Thereby, the digital output without influence of the manufacturing variation, the usage environment, or the like can be obtained.

Although the present invention has been described in terms of exemplary embodiments, it is not limited thereto. It should be appreciated that variations may be made in the embodiments described by persons skilled in the art without departing from the scope of the present invention as defined by the following claims.

What is claimed is:

1. An AD converting device comprising:
   a double integral AD converter having
      an integrator which
         when a first integrated voltage is input to the integrator, performs a first integration in which a difference between the first integrated voltage and a reference voltage is integrated,
         after the first integration is performed and when a second integrated voltage is input to the integrator, performs a second integration in which a difference between the second integrated voltage and the reference voltage is integrated, and
         outputs an integrated voltage according to at least the second integration; and
      an output part which receives the integrated voltage output from the integrator and the reference voltage, counts time from when the second integration is started to when the integrated voltage becomes equal to the reference voltage, and outputs the counted time as a digital value;
   a variable resistance; and
   a resistance-voltage conversion circuit which changes the first integrated voltage in proportion to a product of a resistance value of the variable resistance after being varied in the variable resistance and a value of an electrical current applied to the variable resistance and changes the second integrated voltage and the reference voltage in proportion to a product of a total resistance value of the variable resistance and the electrical current applied to the variable resistance.

2. The AD converting device according to claim 1, wherein
   the variable resistance has fixed terminals at both ends and an adjustment terminal which is grounded;
   the resistance-voltage conversion circuit has two current sources each applying an electrical current to the fixed terminals at the both ends of the variable resistance, two resistances connected in series between the fixed terminals at the both ends of the variable resistance, and a voltage generator generating a first voltage and a second voltage in proportion to a voltage generated at a connection part between the two resistances; and
   the resistance-voltage conversion circuit outputs one of voltages of the fixed terminals of the variable resistance as the first integrated voltage, outputs the first voltage as the second integrated voltage, and outputs the second voltage as the reference voltage.

3. The AD converting device according to claim 1, wherein the resistance-voltage conversion circuit is integrated on one integrated circuit.

4. The AD converting device according to claim 2, wherein the two current sources are configured by a current mirror.

5. A dial-type input device using the AD converting device according to claim 1.

6. A resistance-voltage conversion circuit which is connected to a variable resistance and an AD converting device having;
   a double integral AD converter having
      an integrator which
         when a first integrated voltage is input to the integrator, performs a first integration in which a difference between the first integrated voltage and a reference voltage is integrated,
         after the first integration is performed and when a second integrated voltage is input to the integrator, performs a second integration in which a difference between the second integrated voltage and the reference voltage is integrated, and
         outputs an integrated voltage according to at least the second integration; and
      an output part which receives the integrated voltage output from the integrator and the reference voltage, counts time from when the second integration is started to when the integrated voltage becomes equal to the reference voltage, and outputs the counted time as a digital value, the resistance-voltage conversion circuit comprising
   a voltage output part generating and outputting the first integral voltage based on a resistance value of the variable resistance and generating and outputting the second integrated voltage and the reference voltage; and
   a resistance-voltage conversion part which changes the first integrated voltage in proportion to a product of a resistance value of the variable resistance after being varied in the variable resistance and a value of an electrical current applied to the variable resistance and changes the second integrated voltage and the reference voltage in proportion to a product of a total resistance value of the variable resistance and the electrical current applied to the variable resistance.

7. The resistance-voltage conversion circuit according to claim 6, wherein
   the variable resistance has fixed terminals at both ends and an adjustment terminal which is grounded;
   the resistance-voltage conversion circuit has two current sources each applying an electrical current to the fixed terminals at the both ends of the variable resistance, two resistances connected in series between the fixed terminals at the both ends of the variable resistance, and a voltage generator generating a first voltage and a second voltage in proportion to a voltage generated at a connection part between the two resistances; and
   the resistance-voltage conversion circuit outputs one of voltages of the fixed terminals of the variable resistance as the first integrated voltage, outputs the first voltage as the second integrated voltage, and outputs the second voltage as the reference voltage.

8. The resistance-voltage conversion circuit according to claim 6, wherein the resistance-voltage conversion circuit is integrated on one integrated circuit.

9. The resistance-voltage conversion circuit according to claim 7, wherein the two current sources are configured by a current mirror.

* * * * *